United States Patent
Okada et al.

(10) Patent No.: US 8,860,511 B2
(45) Date of Patent: Oct. 14, 2014

(54) FREQUENCY DIVIDER AND PLL CIRCUIT

(71) Applicant: Semiconductor Technology Academic Research Center, Yokohama (JP)

(72) Inventors: Kenichi Okada, Tokyo (JP); Ahmed Magdi Hassan Musa, Yokohama (JP)

(73) Assignee: Semiconductor Technology Academic Research Center (JP)

(*) Notice: Subject to any disclaimer, the term of this patent is extended or adjusted under 35 U.S.C. 154(b) by 51 days.

(21) Appl. No.: 13/671,938

(22) Filed: Nov. 8, 2012

(65) Prior Publication Data
US 2013/0120073 A1    May 16, 2013

(30) Foreign Application Priority Data
Nov. 10, 2011  (JP) .................................. 2011-246362

(51) Int. Cl.
| | |
|---|---|
| H03L 7/00 | (2006.01) |
| H03L 5/00 | (2006.01) |
| H03L 7/183 | (2006.01) |
| H03L 7/24 | (2006.01) |
| H03B 19/06 | (2006.01) |

(52) U.S. Cl.
CPC . *H03L 5/00* (2013.01); *H03B 19/06* (2013.01); *H03L 7/183* (2013.01); *H03L 7/24* (2013.01)
USPC .............. 331/16; 331/34; 331/57; 331/177 R; 377/47; 327/115; 327/118

(58) Field of Classification Search
CPC ....................................................... H03B 19/06
USPC ........... 331/16, 34, 57, 177 R; 327/115, 118; 377/47
See application file for complete search history.

(56) References Cited

U.S. PATENT DOCUMENTS

| | | | |
|---|---|---|---|
| 8,410,830 B2* | 4/2013 | Mahdavi ....................... | 327/118 |
| 2008/0231379 A1* | 9/2008 | Jang et al. ........................ | 331/57 |
| 2013/0076408 A1* | 3/2013 | Soe ................................ | 327/117 |

OTHER PUBLICATIONS

Mayr et al. "A 90GHz 65nm CMOS Injection-Locked Frequency Divider." *IEEE*. 2007. pp. 198-199 and 596.

* cited by examiner

*Primary Examiner* — Arnold Kinkead
(74) *Attorney, Agent, or Firm* — Merchant & Gould P.C.

(57) ABSTRACT

A frequency divider of an injection locked type capable of division by 2, division by 4, and further division by 8 with a simpler configuration is disclosed and the frequency divider includes a ring oscillator including M (M is an even number) delay elements, the tails of two delay elements M/2 delay elements apart from each other are connected to a differential pair and transistors, to the gates of which the input oscillation signal is applied, are connected to the differential pair, and the differential pair is caused to generate a differential signal of the input oscillation signal, which is a divide-by-2 signal of the input oscillation signal, and when dividing the frequency of the input oscillation signal by 8, the portion of the differential pair to be connected to the tail of the delay element is caused to have a two-stage configuration, which is a vertically stacked configuration.

13 Claims, 12 Drawing Sheets

FREQUENCY DIVIDER AND PLL CIRCUIT

This application claims benefit of Serial No. 2011-246362, filed 10 Nov. 2011 in Japan and which application is incorporated herein by reference. To the extent appropriate, a claim of priority is made to the above disclosed application.

BACKGROUND OF THE INVENTION

1. Technical Field of the Invention

The present invention relates to a frequency divider capable of dividing a frequency in a wide range at high frequencies and a PLL circuit that utilizes the frequency divider and, more specifically, to a frequency divider using an injection locked frequency divider (ILFD) and a PLL circuit that utilizes the frequency divider.

2. Related Art

In recent years, the frequency band utilized for wireless communication is increasing and in accordance, it is necessary to increase the frequency of a clock output from a VCO (voltage controlled oscillator) of a PLL circuit provided within a device. Usually, the reference frequency is much lower than the clock frequency output from the VCO and it is necessary to reduce the frequency by dividing the clock frequency, and therefore, a frequency divider is used. When the VCO generates a clock of tens of GHz, it is difficult to configure a frequency divider by an ordinary digital circuit and as a prescaler configured to divide a clock output from the VCO into a frequency at a certain level, an analog frequency divider is used. It is possible to implement an analog frequency divider by, for example, a current mode logic frequency divider or injection locked frequency divider (ILFD). A current mode logic frequency divider has a wide locking region; however, power consumption is large. The present invention relates to an injection locked frequency divider.

FIG. 1 is a diagram showing an outline of a configuration of an injection locked frequency divider.

An injection locked frequency divider (ILFD) 10 has an oscillation circuit 11 and a locked signal generating circuit 12. The oscillation circuit 11 is a self-oscillation circuit and capable of changing the oscillation frequency in accordance with a locked signal input from the locked signal generating circuit 12. The locked signal generating circuit 12 generates a locked signal to oscillate the oscillation circuit 11 at a target frequency of a frequency-divided signal from an input oscillation signal (clock) $Nf_0$ and injects the locked signal into the oscillation circuit 11.

FIG. 2A and FIG. 2B are diagrams showing a model of an injection locked frequency divider, wherein FIG. 2A shows a model configured to perform division by N and FIG. 2B shows a model configured to perform division by 2.

As shown in FIG. 2A, in this model, a signal (clock) of a reference frequency $f_0$ passes through a transistor having non-linear transconductance and generates higher harmonics. When nothing is injected into the oscillation circuit, these harmonics are attenuated by a low-pass filter (LPF) within the oscillation circuit and many of them are attenuated. However, when a locked signal is injected, these harmonics are mixed with the injected locked signal and a number of additional harmonics are generated. If one of these harmonics has a frequency close to the self-oscillation frequency of the oscillator and enough power, the frequency of the oscillator is pulled into the frequency and locks to the frequency. This action is the direct conversion in which an (N−1)th harmonic is mixed with the locked signal of an Nth harmonic to generate a harmonic having a frequency close to the fundamental frequency of the oscillator and locks thereto. As N increases, the (N−1)th harmonic becomes weaker, and therefore, the locking range becomes narrower. Further, the level of a specific harmonic of the injection locked frequency divider cannot be controlled because the generation process thereof is not linear and affected by a number of factors. Due to this, the locking range becomes narrower and the injection power necessary for a specific division ratio is limited.

As described above, the locking range of the injection locked frequency divider and the necessary injection power differ in accordance with the division ratio and in general, in the case of division by 2, the locking range is wide and the injection power is small. FIG. 2B shows a model of a divide-by-2 injection locked frequency divider.

For the injection locked frequency divider, various kinds of configuration are known and one of them is a circuit that utilizes a ring oscillator (ring-shaped oscillation circuit) in which a plurality of delay elements is connected in the shape of a ring. The ring oscillator has a configuration in which a plurality of delay elements is connected so that the output signal of the previous stage is input as the input signal of the subsequent stage, the output signal of the final stage is input as the input signal of the initial stage, and relative to the input signal of the initial stage, the input signal from the final stage to the initial stage is reversed. The ring oscillator is a widely-known circuit.

FIG. 3A and FIG. 3B are diagrams showing a configuration example of an injection locked frequency divider that utilizes a two-stage ring oscillator, wherein FIG. 3A shows a block diagram and FIG. 3B shows a specific circuit example in which a delay element is implemented by a differential buffer circuit. An example in which a MOS transistor is used is shown, however, it is not limited to this.

In the injection locked frequency divider that utilizes a ring oscillator, by applying a locked signal to part of the delay element that performs the oscillation action to generate harmonics, the ring oscillator is caused to oscillate at a frequency in correspondence to the locked signal. The injection locked frequency divider includes the direct system in which a locked signal is applied to the part that outputs an oscillation signal, the parallel system in which a locked signal is applied to a differential pair provided in parallel to a differential pair that performs the oscillation action, and the system in which a locked signal is applied to the common connection node that connects in common the output node of a differential pair and the node on the opposite side. In general, the transistor that forms a differential pair is called a tail transistor and here, the system in which a locked signal is applied to the common connection node is called a tail system and the common connection node is called a tail.

FIG. 3A shows an injection locked frequency divider that utilizes a tail system ring oscillator. Delay elements DL1 and DL2 are a differential buffer (inverter) and a positive output out+ and a negative output out− of the delay element DL1 of the first stage are connected to a negative input in− and a positive input in+ of the delay element DL2 of the second stage and the positive output out+ and the negative output out− of the delay element DL2 of the second stage are connected to the positive input in+ and the negative input in− of the delay element DL1 of the first stage. Due to this, the output of the second stage corresponding to the input of the first stage is reversed and returned to the input of the first stage again, and thereby, the ring oscillator oscillates. The oscillation frequency of the ring oscillator is determined by the delay times of the two delay elements DL1 and DL2 if there is no injection of a locked signal.

As shown in FIG. 3B, the delay element DL1 is a differential buffer and an input signal is input to the gates of two NMOS transistors forming a differential pair and from the drains of the two NMOS transistors, an output signal is output. The sources of the two NMOS transistors are connected to the common node, that is, the tail, and the common node (tail) is grounded via source transistors M1 and M2. To the gates of the source transistors M1 and M2, a DC bias voltage is applied via a resistor.

In the injection locked frequency divider of FIG. 3A, to the gate of the source transistor M1 of the delay element DL1 of the first stage, a capacitor is further connected and to the other terminal of the capacitor, a locked signal RF2+ is applied. On the other hand, to the gate of the source transistor M2 of the delay element DL2 of the second stage, a capacitor is also connected, however, the other terminal of the capacitor is grounded. The locked signal RF2+ is a signal having a frequency $2f_0$, twice the frequency $f_0$ of a frequency-divided signal output from the injection locked frequency divider. In other words, the injection locked frequency divider of FIG. 3 is a divide-by-2 frequency divider configured to divide the input oscillation signal having the frequency $2f_0$ into the frequency-divided signal having the frequency $f_0$.

The frequency having a tendency to lock of the injection locked frequency divider is determined by the circuit characteristics of the injection locked frequency divider and affected by variations in processes etc. As described above, the locking range and the necessary injection power of the injection locked frequency divider are different depending on the division ratios and there used to be such a problem that it is difficult to stably operate in the state of being locked in a particularly high division ratio. In contrast to this, the model of a divide-by-2 injection locked frequency divider as shown in FIG. 2B has a wide locking range and small injection power generally. P. Mayr, C. Weyers, and U. Langmann ("A 90 GHz 65 nm CMOS Injection-Locked Frequency Divider", IEEE International Solid-State Circuits Conference, Feb 2007, pp. 198-199) describe that two divide-by-2 injection locked frequency dividers are connected in series to perform and division by 4 (×4).

SUMMARY OF THE INVENTION

However, when two injection locked frequency dividers are used, the circuit area increases and power consumption also increases. If division by 8 is performed, the three injection locked frequency dividers are used and there is such a problem that the circuit area and power consumption further increase.

An object of the present invention is to implement an injection locked frequency divider capable of division by 2, division by 4, and further division by 8 with a simpler configuration.

The frequency divider of the present invention is of injection locked type and when dividing the frequency of an input oscillation signal by 4, in the injection locked frequency divider of the tail system that utilizes a ring oscillator including M (M is an even number) delay elements, the tails of two delay elements M/2 delay elements apart from each other are connected to a differential pair and transistors, to the gates of which the input oscillation signal is applied, are connected to the differential pair, and the differential pair is caused to generate a differential signal of the input oscillation signal, that is, a divide-by-2 signal of the input oscillation signal. When dividing the frequency of the input oscillation signal by 8, the portion of the differential pair to be connected to the tail of the delay element is caused to have a two-stage configuration, i.e., a vertically stacked configuration.

BRIEF DESCRIPTION OF THE DRAWINGS

FIG. 3A and FIG. 3B are diagrams each showing a configuration example of the injection locked frequency divider that utilizes a two-stage ring oscillator, wherein FIG. 3A shows a block diagram and FIG. 3B shows a specific circuit example in which a delay element is implemented by a differential buffer circuit;

DESCRIPTION OF THE EMBODIMENTS

Figure 4A:
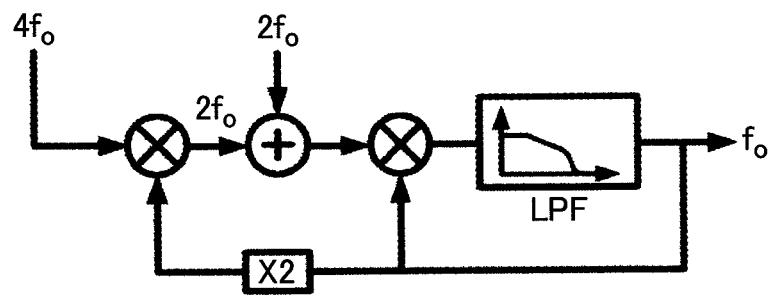
FIG. 4A and FIG. 4B are model diagrams of a frequency divider of the present invention.
Figure 4B:
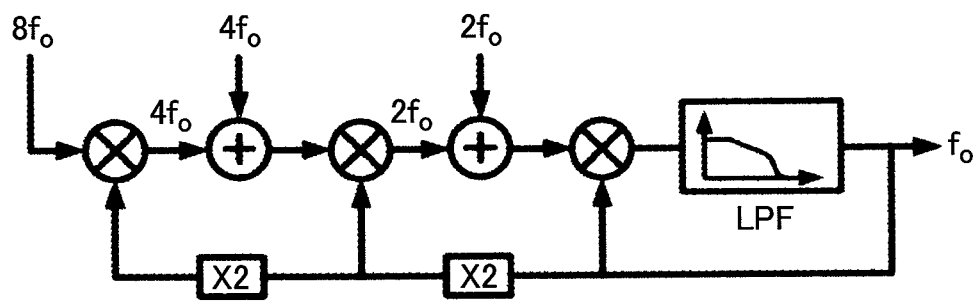

FIG. 4A and FIG. 4B are model diagrams of a frequency divider of the present invention, wherein FIG. 4A shows a case of division by 4 and FIG. 4B shows a case of division by 8. With reference to FIG. 4A and FIG. 4B, the fundamental configuration of the present invention is explained.

In a frequency divider of the present invention, a locked signal of the Nth harmonic is mixed with the (N/2)th harmonic having a fundamental frequency $f_0$ of an oscillation circuit, and then, is further mixed with the (N/4)th harmonic, and this is repeated until a harmonic having a frequency close to the fundamental frequency $f_0$ of the oscillation circuit is generated. In the case of division by 4 shown in FIG. 4A, first, the locked signal of $4f_0$ is mixed with the second harmonic and further mixed with the first harmonic and the oscillation circuit is locked so as to oscillate at a frequency close to the fundamental frequency $f_0$. In the case of division by 8 shown in FIG. 4B, the locked signal of $8f_0$ is mixed with the fourth harmonic and further mixed with the second harmonic, and finally mixed with the first harmonic and the oscillation circuit is locked so as to oscillate at a frequency close to the fundamental frequency $f_0$.

Figure 1:
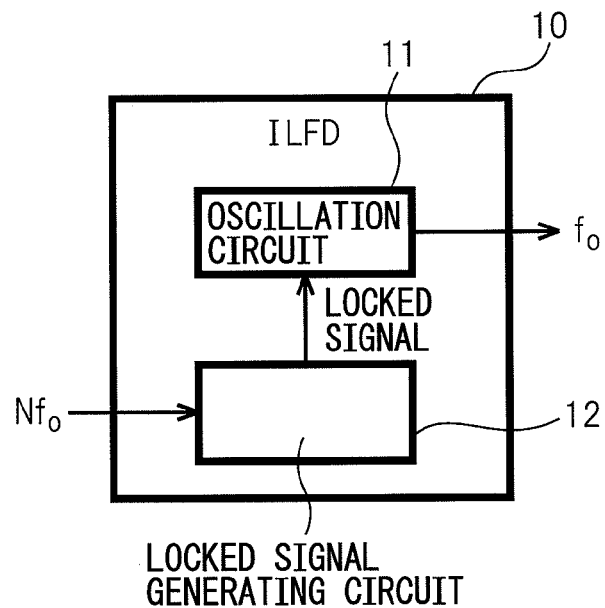
FIG. 1 is a diagram showing an outline of a configuration of an injection locked frequency divider.
Figure 2A:
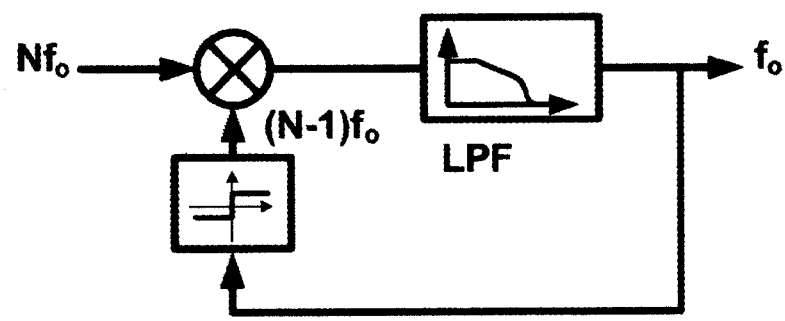
FIG. 2A and FIG. 2B are diagrams each showing a model of the injection locked frequency divider.

While the locked signal is mixed with the (N−1)th harmonic in the example shown in FIG. 2A, in the present invention, the locked signal is mixed with the (N/2)th harmonic. The (N/2)th harmonic has larger power compared to the (N−1)th harmonic, and therefore, it is possible to inject a large locked signal into the injection locked frequency divider.

According to the present invention, it is necessary to generate higher harmonics of the fundamental frequency $f_0$ and this is implemented by generating the Nth harmonic by mixing N phases of a signal to cancel out all the harmonics of up to the (N−1)th harmonic. In each stage to generate a locked signal, all the lower and strong harmonics that adversely affect the locking operation are filtered to leave only harmonics of desired orders. Due to this, the locked signal is mixed with the strongest harmonic in each stage, and therefore, there is no longer a division ratio in which another harmonic becomes stronger and oscillates. Due to this, division ratios do not overlap, and therefore, it is possible to securely obtain a desired division ratio.

Figure 2B:
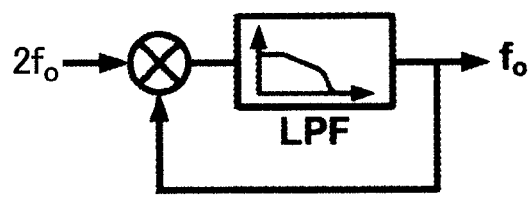

Further, when dividing by 4 by connecting the two divide-by-2 frequency dividers of FIG. 2B in series, the locking range of the two divide-by-2 frequency dividers is the combination of the locking ranges of the divide-by-2 frequency dividers of the first stage and the second stage, respectively. Due to the manufacturing processes, the two divide-by-2 frequency dividers have different characteristics and the locking ranges are different, and therefore, the substantial locking range is reduced accordingly. In contrast to this, in the frequency divider of the present invention, there is only one frequency divider having a ring oscillator and the $(N/2^n)$th harmonic is generated by the locked signal generating circuit configured to generate a locked signal, and therefore, the locking range is not reduced.

Furthermore, according to the present invention, by switching the stages on the way of the locked signal generating circuit into which a locked signal is injected, it is also possible to input an oscillation signal in a lower division ratio as a locked signal. For example, in FIG. 4A, when $2f_0$ is input but $4f_0$ is not input, the frequency divider operates as a divide-by-2 frequency divider and when $4f_0$ is input but $2f_0$ is not input, the frequency divider operates as a divide-by-4 frequency divider. Similarly, in FIG. 4B, when $2f_0$ is input but $4f_0$ or $8f_0$ is not input, the frequency divider operates as a divide-by-2 frequency divider, when $4f_0$ is input but $2f_0$ or $8f_0$ is not input, the frequency divider operates as a divide-by-4 frequency divider, and when $8f_0$ is input but $2f_0$ or $4f_0$ is input, the frequency divider operates as a divide-by-8 frequency divider.

According to the present invention, it is possible to implement a frequency divider capable of division by 4 or more, i.e., division by $2^i$ (i is an integer) and configured to lock to a desired frequency in a stable manner with a small circuit scale, and therefore, power consumption can be reduced.

Figure 5:
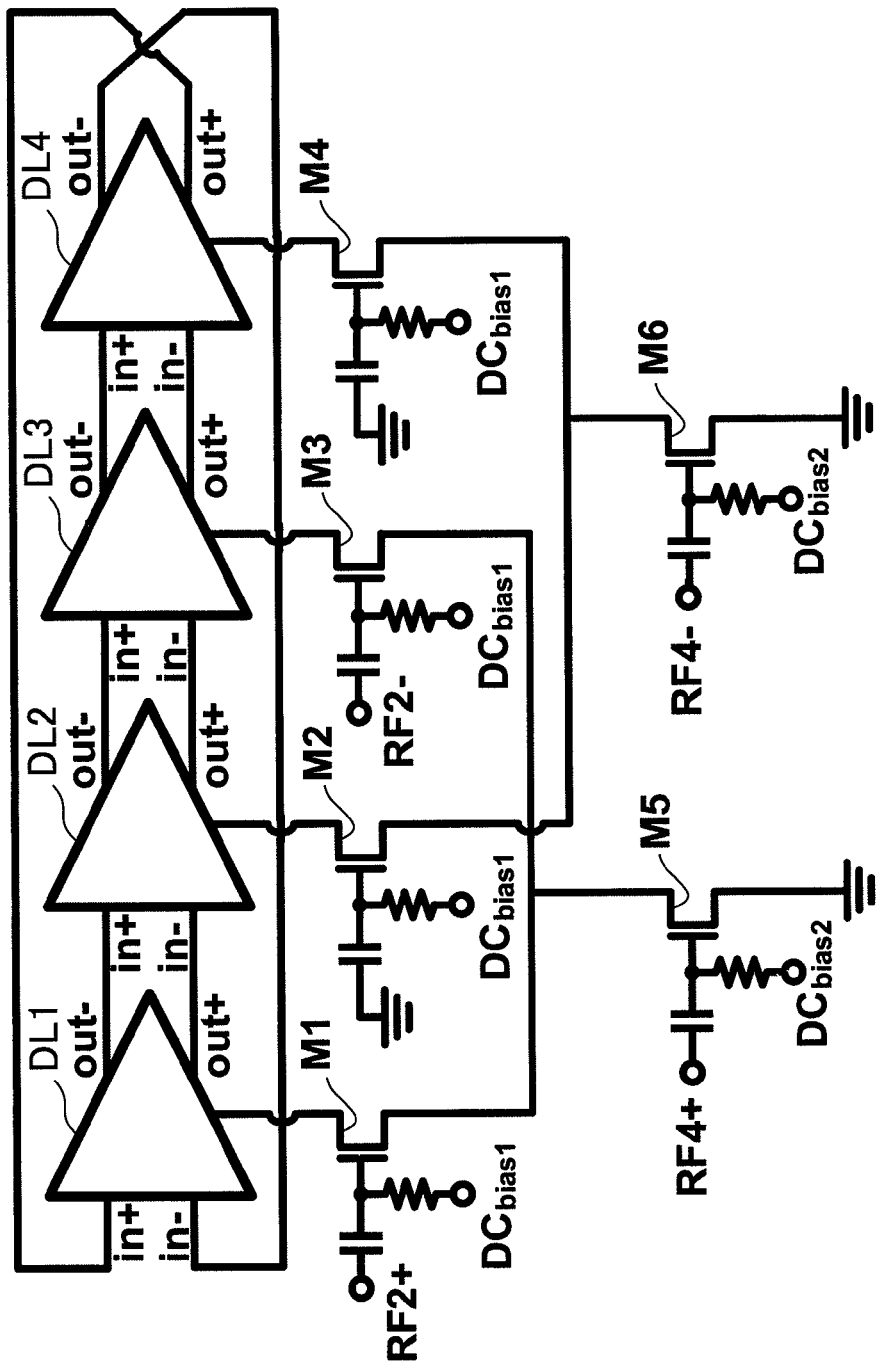
FIG. 5 is a diagram showing a configuration of a frequency divider of a first embodiment of the present invention.
Figure 6:
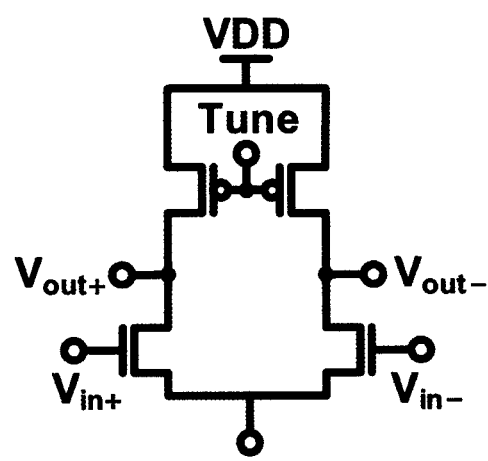
FIG. 6 is a diagram showing a circuit example of a differential buffer circuit forming a delay element used in the frequency divider of the first embodiment.

FIG. 5 is a diagram showing a configuration of a frequency divider of a first embodiment. FIG. 6 is a diagram showing a circuit example of a differential buffer circuit forming delay elements DL1 to DL4 used in the frequency divider of the first embodiment. In the following explanation, an example is explained, in which a MOS transistor is used; however, the present invention is not limited to this and it is also possible to use a bipolar transistor, etc. In relation to this, there is a case where a terminal to which a control signal of the gate, etc., of the MOS transistor is input is called a control terminal and a terminal at which the current is controlled by a control signal of the drain, etc., of the MOS transistor is called a terminal to be controlled.

To the frequency divider of the first embodiment, differential input oscillation signals RF4+ and RF4− or RF2+ and RF2− are input selectively and when RF4+ and RF4− are input, the frequency divider generates a signal, which is the input oscillation signal divided by 4, and when RF2+ and RF2− are input, the frequency divider generates a signal, which is the input oscillation signal divided by 2.

As shown in FIG. 5, the frequency divider of the first embodiment has an oscillator (ring oscillator) connecting the four delay elements DL1 to DL4 in the shape of a ring and a locked signal generating circuit including transistors M1 to M6.

Figure 3A:
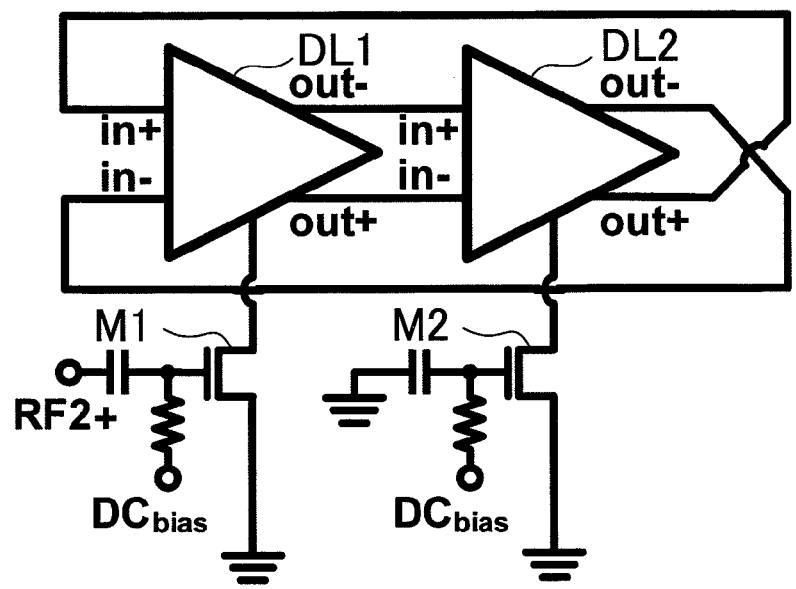
Figure 3B:
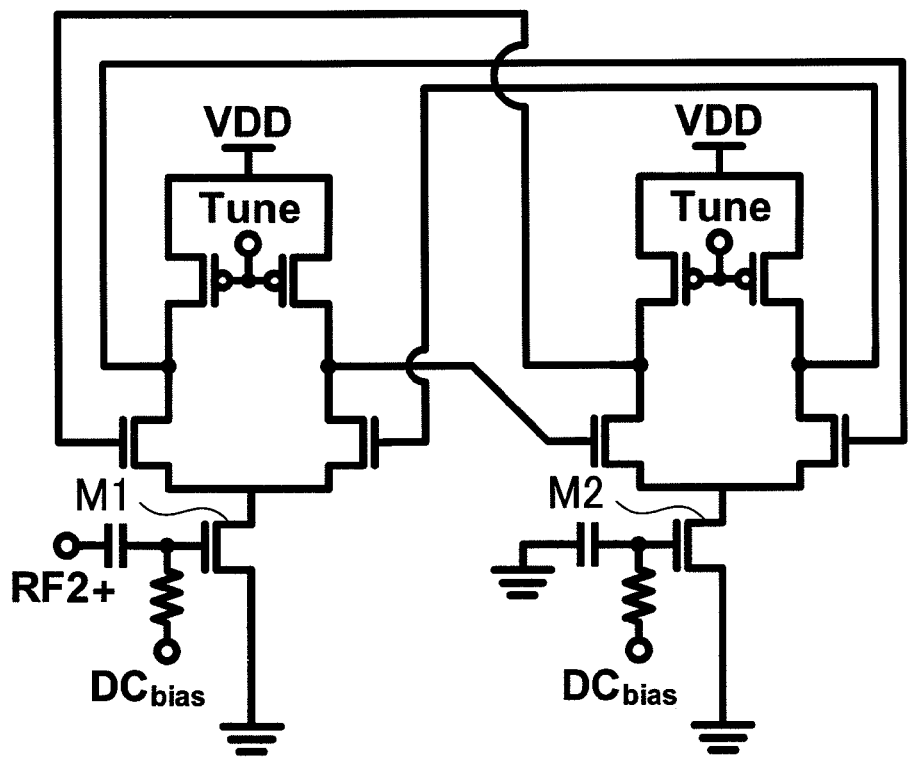

The ring oscillator has the four delay elements DL1 to DL4 connected so that the output signal of the previous stage is input as the input signal of the subsequent stage, the output signal of the final stage is input as the input signal of the initial stage, and relative to the input signal of the initial stage, the input signal from the final stage to the initial stage is reversed. The delay elements DL1 to DL4 are formed by the buffer circuit shown in FIG. 6 and the like, however, the circuit is not limited to the buffer circuit and any circuit may be used as long as the circuit is capable of operating as a delay element. The buffer circuit of FIG. 6 is the circuit shown in FIG. 3B and the operation speed is adjusted by applying a direct current (DC) bias voltage to a terminal Tune, although explanation thereof is omitted because it is widely known.

As shown in FIG. 5, a positive output out+ and a negative output out− of the delay element DL1 of the first stage are connected to a negative input in− and a positive input in+ of the delay element DL2 of the second stage, respectively. In this manner, connection is made until the fourth stage is reached and the positive output out+ and the negative output out− of the delay element DL4 of the fourth stage are connected to the positive input in+ and the negative input in− of the delay element DL1 of the first stage. Due to this, the output of the fourth stage corresponding to the input of the first stage is reversed and returned again to the input of the first stage, and thereby, the ring oscillator oscillates. The oscillation frequency of the ring oscillator is determined by the delay times of the four delay elements DL1 to DL4 if no locked signal is injected.

The common nodes (tails) of the differential pairs of the delay elements DL1 to DL4 are connected to the drains of the auxiliary injection transistors M1 to M4, respectively. The sources of the auxiliary injection transistors M1 and M3 are connected to the common connection node and between the common connection node and the ground, the signal injection transistor M5 is connected. Similarly, the sources of the auxiliary injection transistors M2 and M4 are connected to the common connection node and between the common connection node and the ground, the signal injection transistor M6 is connected. Consequently, the auxiliary injection transistors M1 and M3, and M2 and M4 form a differential pair, respectively.

The gate of the signal injection transistor M5 is configured so that a second bias voltage DCbias2 is applied via a resistor and at the same time, the input oscillation signal RF4+ can be applied via a capacitor. The gate of the signal injection transistor M6 is configured so that the second bias voltage DCbias2 is applied via a resistor and at the same time, the input oscillation signal RF4− can be applied via a capacitor. The gate of the auxiliary injection transistor M1 is configured so that a first bias voltage DCbias1 is applied via a resistor and at the same time, the input oscillation signal RF2+ can be applied via a capacitor. The gate of the auxiliary injection transistor M3 is configured so that the first bias voltage DCbias1 is applied via a resistor and at the same time, the input oscillation signal RF2− can be applied via a capacitor. To the gates of the auxiliary injection transistors M2 and M4, the first bias voltage DCbias1 is applied via a resistor and at the same time, the gates are grounded via a capacitor, respectively. It may also be possible to enable the signals, such as RF4+, RF4−, RF2+, and RF2−, biased at each bias voltage to be input to the gates not via a capacitor.

Figure 7:
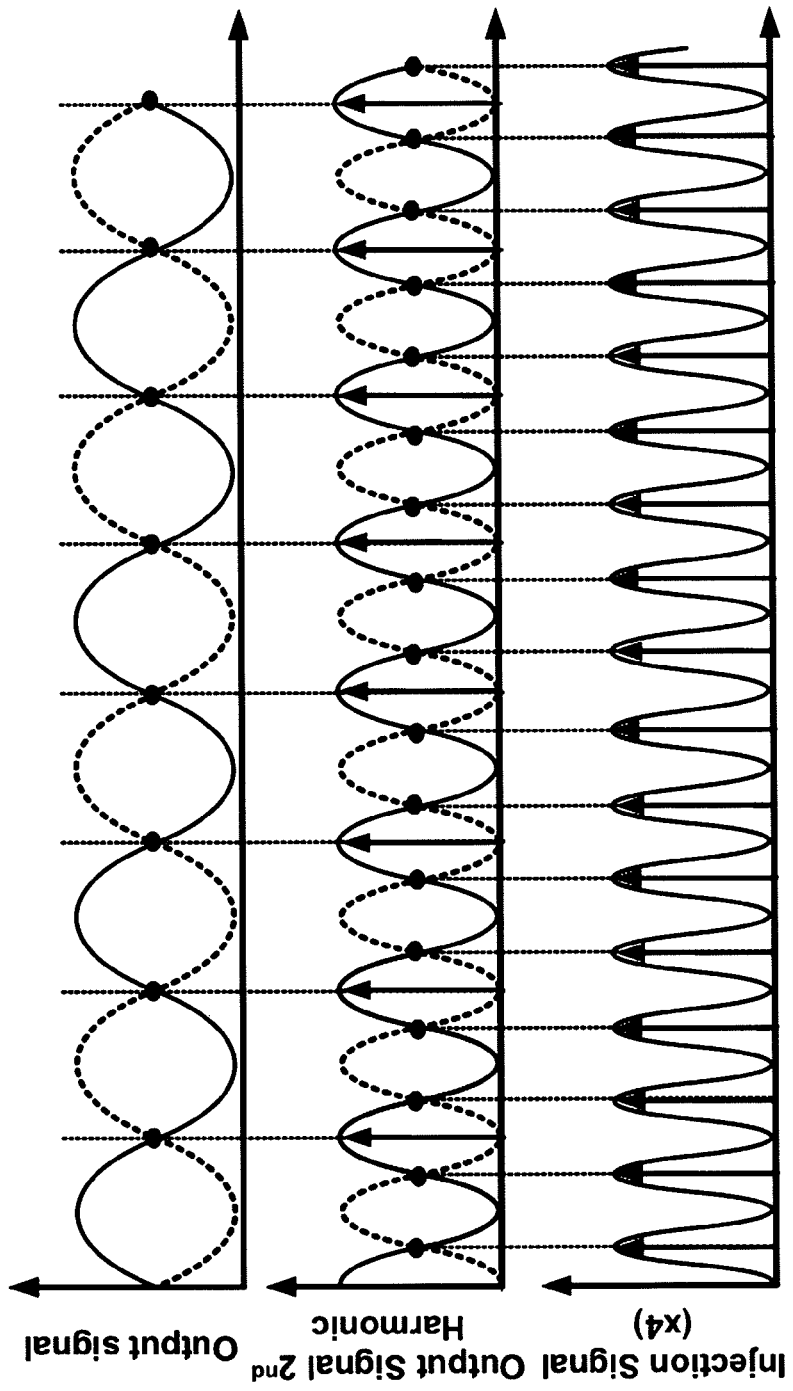
FIG. 7A to FIG. 7C are diagrams for explaining the operation of the frequency divider of the first embodiment.

FIG. 7A to FIG. 7C are diagrams for explaining the operation of the frequency divider of the first embodiment and showing the operation when the input oscillation signals RF4+ and RF4− are input but RF2+ and RF2− are not input.

As shown in FIG. 7C, as the input oscillation signals RF4+ and RF4−, an oscillation signal having a frequency $4f_0$ is input to the gates of the signal injection transistors M5 and M6. In order to simplify the drawing, in FIG. 7C, only the input oscillation signal RF4+ is shown and RF4− is not shown schematically. RF4− is a signal in opposite phase of RF4+.

To the gates of the auxiliary injection transistors M1 and M3, the first bias voltage DCbias1 is applied and the auxiliary injection transistor M1 and M3 are in a state of having a predetermined transconductance. In this state, if the signal injection transistor M5 changes the transconductance in accordance with RF4+ applied to the gate, a signal generated by the change in the transconductance of the signal injection transistor M5 and overlapped by the above-mentioned harmonic is generated at the common connection node connecting the sources of the auxiliary injection transistors M1 and M3. This signal includes a lot of difference components between RF4+ and the divide-by-2 signal of RF4+, i.e., the divide-by-2 components of RF4+. The signal generated at the common connection node is transmitted to the drains of the auxiliary injection transistors M1 and M3, however, at this time, the signals generated at the drains of the auxiliary injection transistors M1 and M3 are in opposite phase due to the difference in the characteristics between the auxiliary injection transistors M1 and M3. In other words, at the drains of the auxiliary injection transistors M1 and M3, signals in opposite phases including a lot of difference components between RF4+ and the divide-by-2 signal of RF4+, i.e., the divide-by-2 components of RF4+ are generated. The solid line and the broken line of FIG. 7B indicate the signals generated at the drains of the auxiliary injection transistors M1 and M3. These signals are each the second harmonic signal having a frequency half that of RF4+ of FIG. 7C, i.e., RF4+ divided by 2, and are in opposite phases.

The drains of the auxiliary injection transistors M1 and M3 are further connected to the connection nodes of the differential pairs of the delay elements DL1 and DL3 and the turning on and off operation of the transistors of the differential pairs of the delay elements DL1 and DL3 is affected by the signals at the drains of the auxiliary injection transistors M1 and M3.

The above explanation also applies to the signal injection transistor M6, the auxiliary injection transistors M2 and M4, and the differential pairs of the delay elements DL2 and DL4 and the turning on and off operation of the transistors of the differential pairs of the delay elements DL2 and DL4 is affected by the signals at the drains of the auxiliary injection transistors M2 and M4.

The ring oscillator is affected by each signal at each part as described above and locks to and oscillates at the frequency $f_0$, which is the frequency $4f_0$ of RF4+ and RF4− divided by 4. In the locked state, the output signal of the final stage of the ring oscillator, that is, the input signal of the delay element DL1 of the first stage will be a signal as shown by the solid line in FIG. 7A and the input signal of the delay element DL3 of the third stage will be a signal shown by the solid line in FIG. 7B.

In the frequency divider of the first embodiment, when the input oscillation signals RF2+ and RF2− are input but RF4+ and RF4− are not input, as the second harmonic of FIG. 7B, RF2+ and RF2− are input directly and the ring oscillator outputs divide-by-2 signals of RF2+ and RF2− shown in FIG. 7A.

Figure 8:
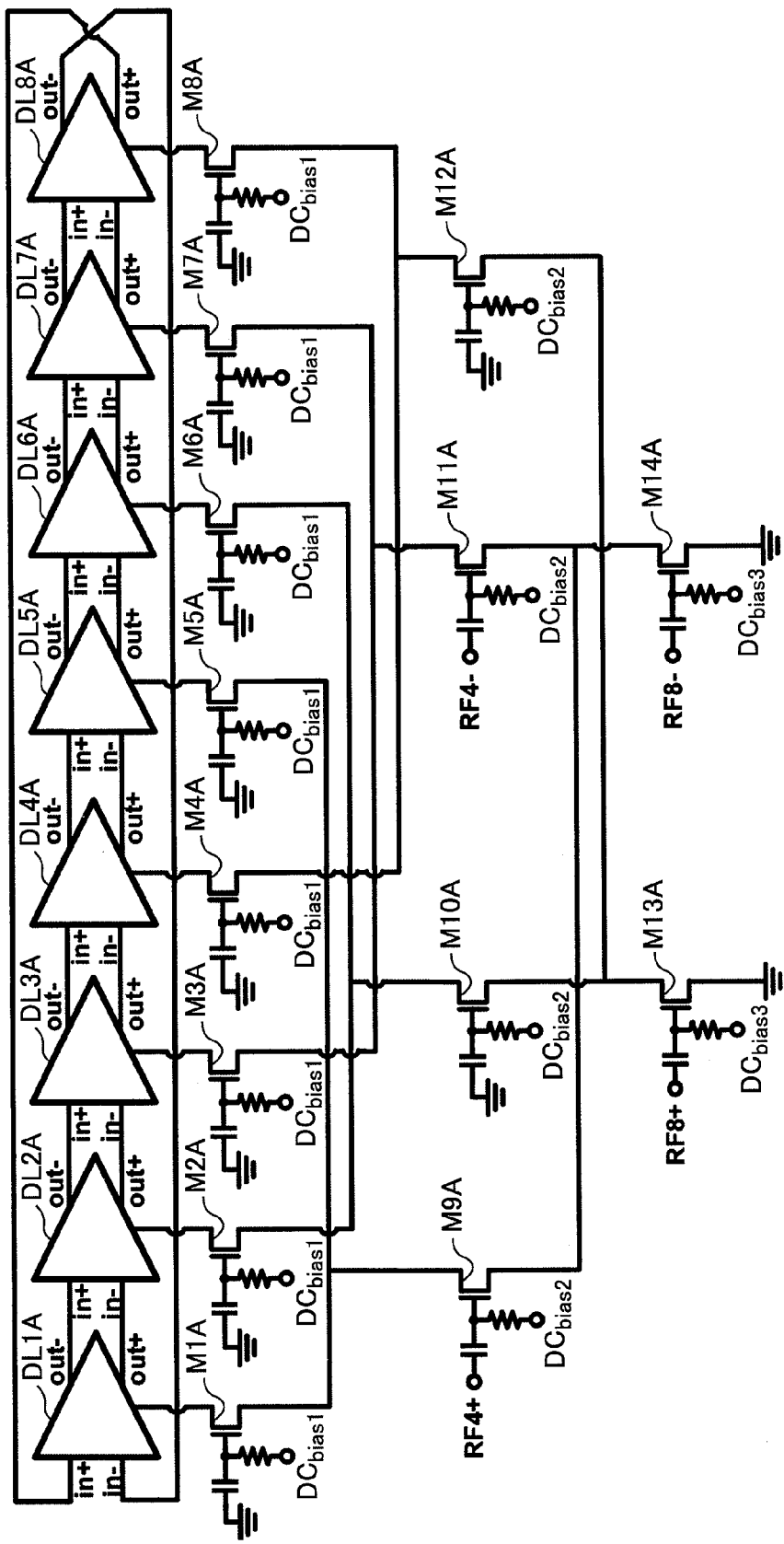
FIG. 8 is a diagram showing a configuration of a frequency divider of a second embodiment of the present invention.
Figure 9:
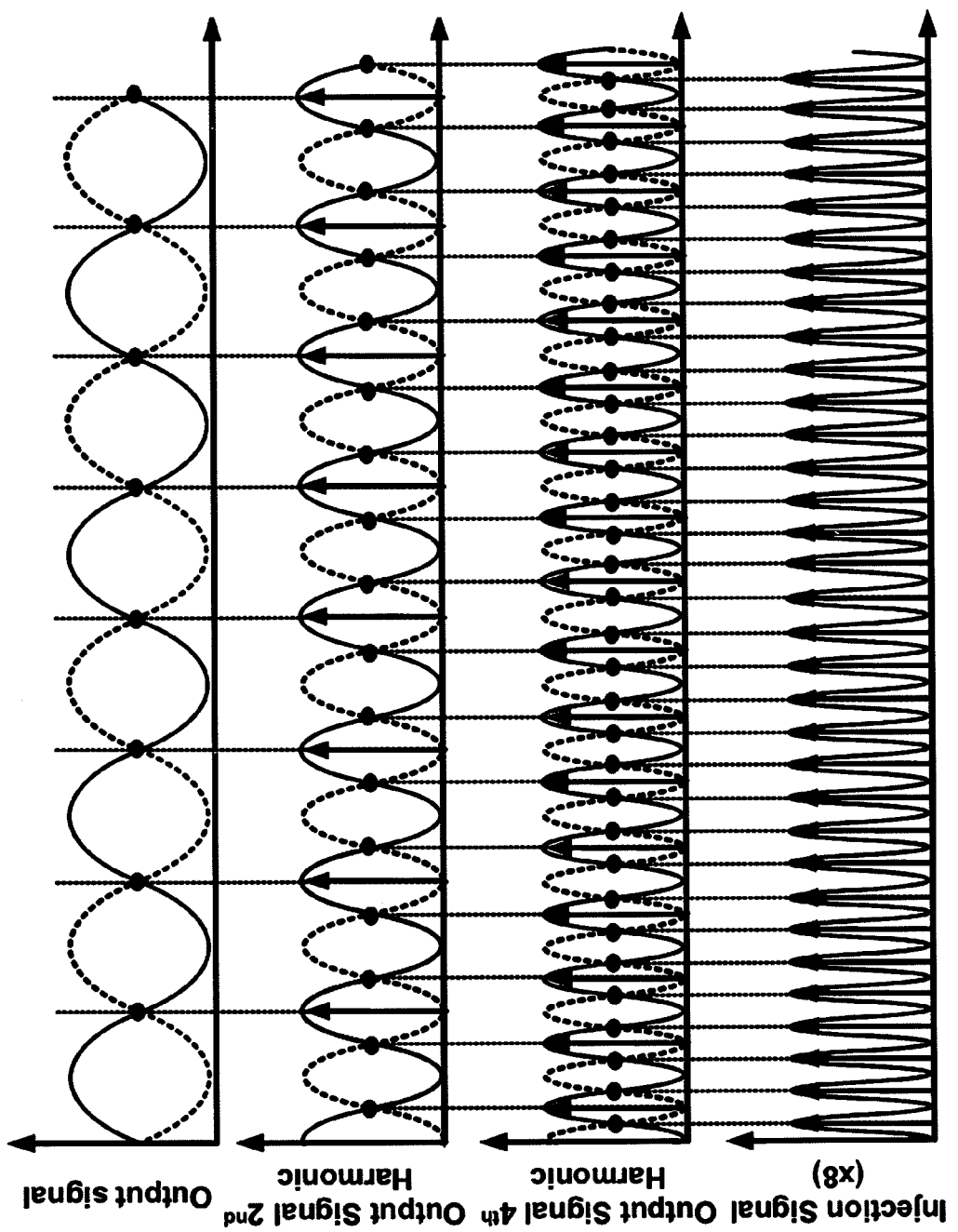
FIG. 9A to FIG. 9D are diagrams for explaining the operation of the frequency divider of the second embodiment.

FIG. 8 is a diagram showing a configuration of a frequency divider of a second embodiment of the present invention.

In the frequency divider of the second embodiment, differential input oscillation signals RF8+ and RF8− or the input oscillation signals RF4+ and RF4− are input selectively and when RF8+ and RF8− are input, the frequency divider generates a signal, which is the input oscillation signal divided by 8 and when RF4+ and RF4− are input, generates a signal, which is the input oscillation signal divided by 4.

As shown in FIG. 8, the frequency divider of the second embodiment has an oscillator (ring oscillator) connecting eight delay elements DL1A to DL8A in the shape of a ring and a locked signal generating circuit including transistors M1A to M14A.

The ring oscillator has the eight delay elements DL1A to DL8A connected so that the output signal of the previous stage is input as the input signal of the subsequent stage, the output signal of the final stage is input as the input signal of the initial stage, and relative to the input signal of the initial stage, the input signal from the final stage to the initial stage is reversed. The delay elements DL1A to DL8A are formed by the buffer circuit shown in FIG. 6; however, they are not limited to that.

The common nodes (tails) of the differential pairs of the delay elements DL1A to DL8A are connected to the drains of the initial stage injection transistors M1A to M8A, respectively. The sources of the initial stage injection transistors M1A and M5A are connected to the common connection node and the common node is further connected to the drain of the auxiliary injection transistor M9A. In the same manner, the sources of M2A and M4A are connected in common to the drain of M10A, the sources of M3A and M7A are connected in common to the drain of M11A, and the sources of M4A and M8A are connected in common to the drain of M12A. Further, the sources of M9A and M11A are connected in common to the drain of M13A and the sources of M10A and M12A are connected in common to the drain of M14A. The initial stage injection transistors M1A and M5A, M2A and M4A, M3A and M7A, and M4A and M8A form differential pairs, respectively. Similarly, the sources of M9A and M11A, and M10A and M12A form differential pairs, respectively.

The gate of the signal injection transistor M13A is configured so that a third bias voltage DCbias3 is applied via a resistor and at the same time, the input oscillation signal RF8+ can be applied via a capacitor. The gate of the signal injection transistor M14A is configured so that the third bias voltage DCbias3 is applied via a resistor and at the same time, the input oscillation signal RF8− can be applied via a capacitor. The gate of the auxiliary injection transistor M9A is configured so that the second bias voltage DCbias2 is applied via a resistor and at the same time, the input oscillation signal RF4+ can be applied via a capacitor. The gate of the auxiliary injection transistor M11A is configured so that the second bias voltage DCbias2 is applied via a resistor and at the same time, the input oscillation signal RF4− can be applied via a capacitor. To the gates of the other transistors M1A to M8A, M10A, and M12A, the first bias voltage DCbias1 is applied via a resistor and at the same time, the gates are grounded via a capacitor, respectively.

As above, the frequency divider of the second embodiment is the frequency divider of the first embodiment in which the locked signal generating circuit is caused to have a three-stage configuration and as in the first embodiment, the differential pair of M9A and M11A of the second stage and M13A of the first stage, and the differential pair of M10A and M12A of the second stage and M14A of the first stage generate the second harmonics of RF8+ and RF8− at the drains of M9A and M11A and at the drains of M10A and M12A. Similarly, the differential pair of M1A and M5A of the first stage and M9A of the second stage generate the fourth harmonics of RF8+ and RF8− at the drains of M1A and M5A. In the same manner, to the drains of the initial stage injection transistors M1A to M8A of the first stage, i.e., to the tails of the delay elements DL1A to DL8A, the fourth harmonics of RF8+ and RF8− are applied.

FIG. 9A to FIG. 9D are diagrams for explaining the operation of the frequency divider of the second embodiment and showing the operation when the input oscillation signals RF8+ and RF8− are input but RF4+ and RF4− are not input.

The operation of the frequency divider of the second embodiment of FIG. 9A to FIG. 9D is the same as the operation of the frequency divider of the first embodiment except in that the number of stages increases by one, and therefore, explanation thereof is omitted.

Figure 10:
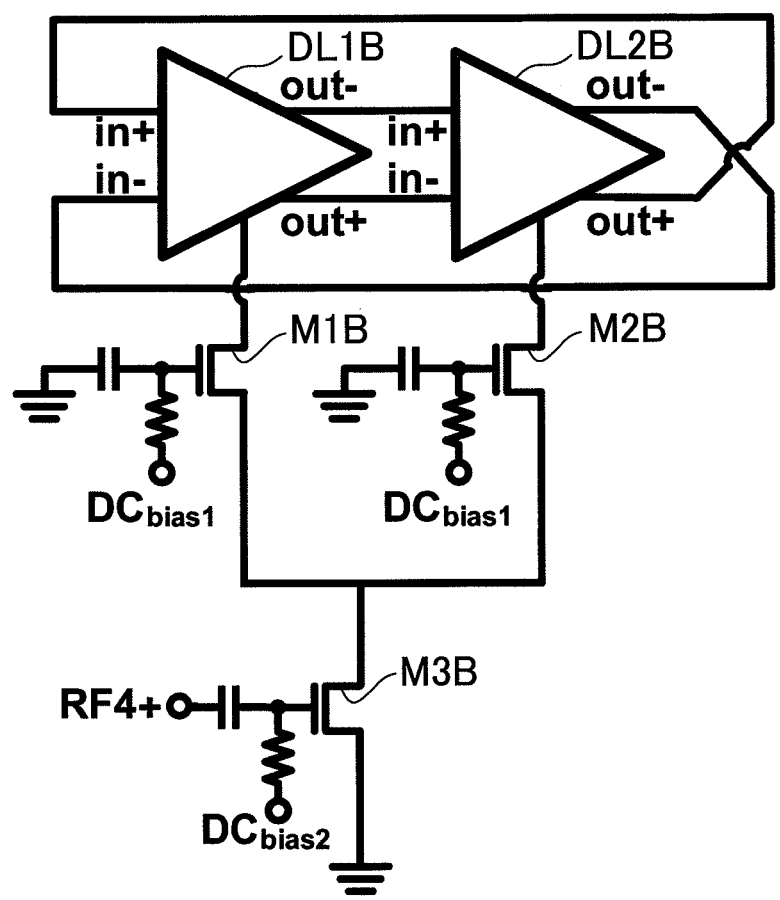
FIG. 10 is a diagram showing a configuration of a frequency divider of a third embodiment of the present invention.

FIG. 10 is a diagram showing a configuration of a frequency divider of a third embodiment of the present invention.

To the frequency divider of the third embodiment, the differential input oscillation signal RF4+ is input and the frequency divider generates a signal, which is RF4 divided by 4.

As shown in FIG. 10, the frequency divider of the third embodiment has an oscillator (ring oscillator) connecting two delay elements DL1B and DL2B in the shape of a ring and a locked signal generating circuit including transistors M1B to M3B.

The ring oscillator has the two delay elements DL1B and DL2B connected so that the output signal of the previous stage is input as the input signal of the subsequent stage and the output signal of the subsequent stage is input as the input signal of the initial stage and relative to the input signal of the initial stage, the input signal from the subsequent stage to the initial stage is reversed. The delay elements DL1B and DL2B are formed by the buffer circuit shown in FIG. 6; however, they are not limited to that.

The common nodes (tails) of the differential pairs of the delay elements DL1B and DL2B are connected to the drains of the auxiliary injection transistors M1B and M2B, respectively. The sources of M1B and M2B are grounded via the signal injection transistor M3B.

To the gate of the signal injection transistor M3B, the second bias voltage DCbias2 is applied via a resistor and at the same time, the input oscillation signal RF4+ is applied via a capacitor. To the gates of the auxiliary injection transistors M1B and M2B, the first bias voltage DCbias1 is applied via a resistor and at the same time, the gates are grounded via a capacitor.

As above, the frequency divider of the third embodiment is the frequency divider of the first embodiment in which the ring oscillator is caused to have a two-stage configuration and only the input oscillation signal RF4+ is input but RF4− is not input, however, as in the first embodiment, locks to a frequency quarter that of RF4+ and outputs a frequency-divided signal, which is RF4+ divided by 4. The operation of the frequency divider of the third embodiment is the same as the explanation of the first embodiment, and therefore, explanation thereof is omitted.

Figure 11:
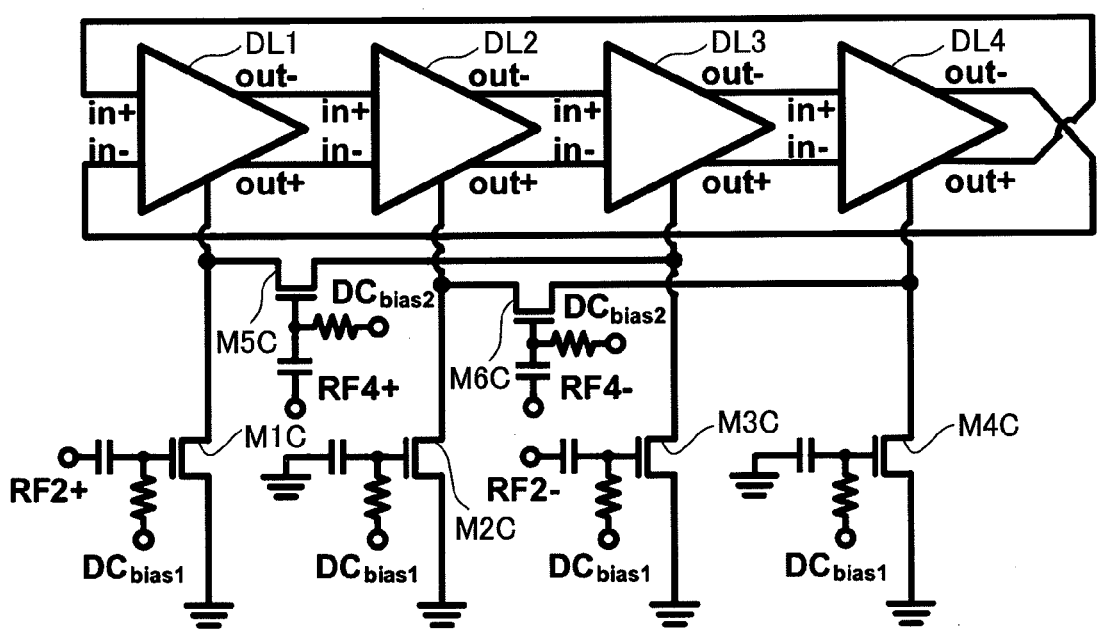
FIG. 11 is a diagram showing a configuration of a frequency divider of a fourth embodiment of the present invention.

FIG. 11 is a diagram showing a configuration of a frequency divider of a fourth embodiment of the present invention.

To the frequency divider of the fourth embodiment, the differential input oscillation signals RF4+ and RF4− or RF2+ and RF2− are input selectively and when RF4+ and RF4− are input, the frequency divider generates a signal, which is the input oscillation signal divided by 4, and when RF2+ and RF2− are input, generates a signal, which is the input oscillation signal divided by 2.

As shown in FIG. 11, the frequency divider of the fourth embodiment has an oscillator (ring oscillator) connecting the four delay elements DL1 to DL4 in the shape of a ring and a locked signal generating circuit including transistors M1C to M6C.

The ring oscillator is the same as that of the first embodiment, and therefore, explanation thereof is omitted.

The common nodes (tails) of the differential pairs of the delay elements DL1 to DL4 are connected to the drains of the auxiliary injection transistors M1C and M4C, respectively. The sources of the auxiliary injection transistors M1C to M4C are grounded. The gate of the auxiliary injection transistor M1C is configured so that the first bias voltage DCbias1 is applied via a resistor and at the same time, the input oscillation signal RF2+ can be applied via a capacitor. The gate of the auxiliary injection transistor M3C is configured so that the first bias voltage DCbias1 is applied via a resistor and at the same time, the input oscillation signal RF2− can be applied via a capacitor. To the gates of the auxiliary injection transistors M2C and M4C, the first bias voltage DCbias1 is applied and a the same time, the gates are grounded via a capacitor, respectively.

Between the drains of the auxiliary injection transistors M1C and M3C, the signal injection transistor M5C is connected. Similarly, between the drains of the auxiliary injection transistors M2C and M4C, the signal injection transistor M6C is connected. The gate of the signal injection transistor M5C is configured so that the second bias voltage DCbias2 is applied via a resistor and at the same time, the input oscillation signal RF4+ can be applied via a capacitor. The gate of the signal injection transistor M6C is configured so that the second bias voltage DCbias2 is applied via a resistor and at the same time, the input oscillation signal RF4− can be applied via a capacitor.

The operation is explained when the input oscillation signals RF4+ and RF4− are input but RF2+ and RF2− are not input in the frequency divider of the fourth embodiment. In this case also, as in the first embodiment, the signal injection transistor M5C changes the transconductance in accordance with the RF4+ applied to the gate. In response to this, the conductance between the drains of the auxiliary injection transistors M2C and M4C changes and at the same time, at the drains of the auxiliary injection transistors M2C and M4C, the harmonics of RF4+ are generated. The harmonics include a lot of the second harmonic components of RF4+, i.e., the divide-by-2 components of RF4+ and the signal at the drain of M2C and the signal at the drain of M4C are in opposite phases. Consequently, as explained in the first embodiment, the turning on and off operation of the transistors of the differential pairs of the delay elements DL1 and DL3 is affected by the signals at the drains of the auxiliary injection transistors M1C and M3C and the ring oscillator locks to and oscillates at the frequency $f_0$, which is the frequency $f_0$ of RF4+ and RF4− divided by 4.

In the first to fourth embodiment explained above, examples are explained in which the delay element with the PMOS current source is used and the transistor of the locked signal generating circuit is implemented by NMOS. However, it is possible to use a delay element with an NMOS current source, to use a cross-coupled current source, and to use a current source in which PMOS is diode-connected via a resistor. Further, it is also possible to implement the transistor of the locked signal generating circuit by PMOS.

Figure 12:
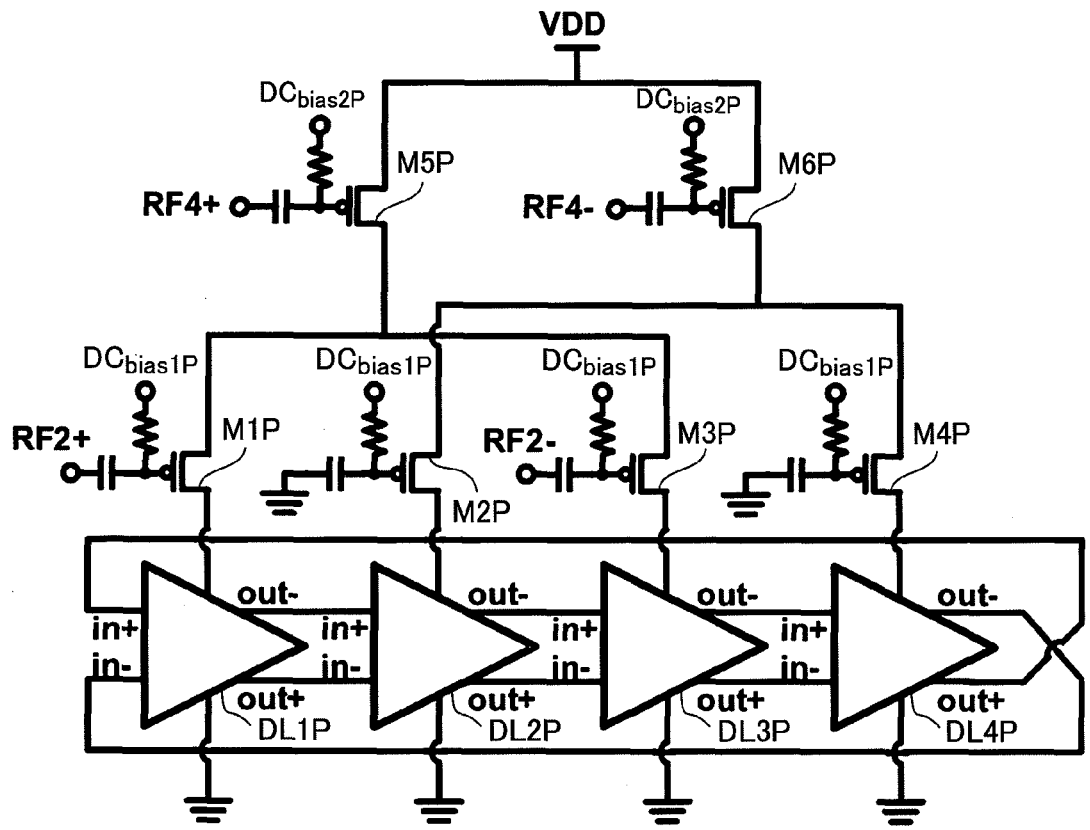
FIG. 12 is a diagram showing a frequency divider of a modified example in which a ring oscillator is formed using delay elements DL1P to DL4P of a PMOS current source and a locked signal generating circuit is implemented by PMOS transistors M1P to M5P.
Figure 13:
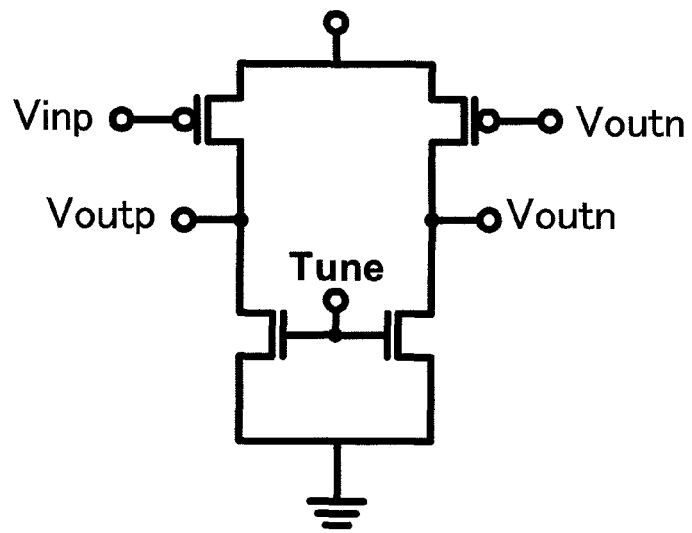
FIG. 13 is a diagram showing a configuration example of a delay element used in the modified example.

FIG. 12 is a diagram showing a frequency divider of a modified example, in which a ring oscillator is formed by delay elements DL1P to DL4P with the PMOS current source and a locked signal generating circuit is implemented by PMOS transistors M1P to M6P and FIG. 13 is a diagram showing a configuration example of the delay element used in the modified example.

This modified example is the frequency divider of the first embodiment modified only as described above, and therefore, explanation thereof is omitted.

Further, in the first to fourth embodiment and the modified example explained above, the delay element is of differential type, however, it is also possible to use a single-phase delay element configured to input and output a single-phase signal.

It s possible to use the frequency divider of the present invention as part of a PLL circuit.

Figure 14:
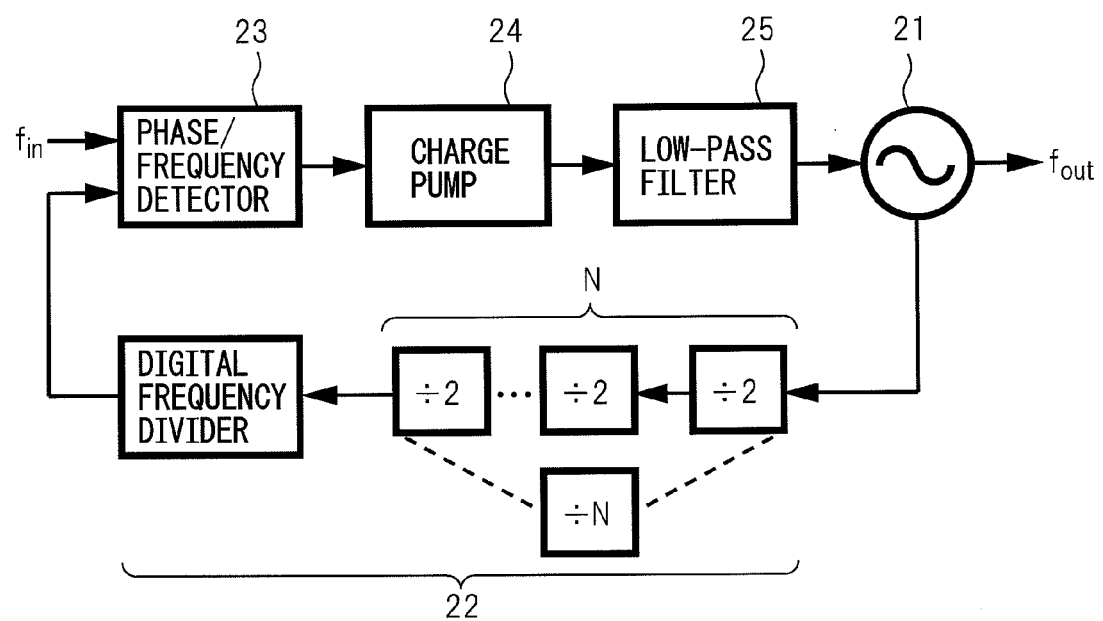
FIG. 14 is a diagram showing a configuration example of a PLL circuit using the frequency divider of the present invention.

FIG. 14 is a diagram showing a configuration example of a PLL circuit using the frequency divider of the present invention.

As shown in FIG. 14, the PLL circuit has a voltage-controlled oscillator (VCO) 21, a frequency divider 22 configured to divide a clock $f_{out}$ output from the VCO 21 and to output a divided clock, a phase frequency detection circuit 23 configured to detect a phase difference and frequency difference between a reference clock $f_{in}$ and the divided clock and to output a control signal, a charge pump (CP) 24 configured to generate a level signal in accordance with the control signal, and a low-pass filter (LPF) 25 configured to output a low frequency signal, which is a low frequency component extracted from the level signal, and the VCO 21 changes the oscillation frequency in accordance with the low frequency signal output from the low-pass filter 25.

When the frequency of the clock $f_{out}$ is very high, for example, 10 GHz or more, it is difficult to form the frequency divider of the clock $f_{out}$ by a digital circuit. Consequently, it is performed that after the clock $f_{out}$ is divided into a frequency of certain magnitude by a prescaler formed by an analog circuit, the clock is further divided by a digital frequency divider formed by a digital circuit. For example, the frequency divider 22 is configured by a prescaler configured to divide the clock $f_{out}$ of 20 GHz by 4 and a digital frequency divider configured to further divide the divided clock of 5 GHz divided by 4.

When a prescaler is implemented by a conventional divide-by-2 frequency divider capable of operating in a stable division ratio, two divide-by-2 frequency dividers are connected in series in two stages, and therefore, there is such a problem that the circuit scale and power consumption are large and the locking range is reduced. In the case of a prescaler configured to perform division by 8, it is necessary to connect three divide-by-2 frequency dividers in series, and therefore, the problem becomes more remarkable.

In contrast to the above, if a prescaler is implemented by using the frequency divider of the present invention explained in the first to fourth embodiment and the modified example, the above-described problem can be alleviated. Further, by changing the input node of the input oscillation signal, it is possible for the frequency divider of the present invention to set the division ratio of the frequency divider to 2, 4, and 8 and to deal with the clock $f_{out}$ in a wide range. For example, if the divide-by-4 frequency divider of the present invention having a self-oscillation range from 2 GHz to 8 GHz is used, it is possible to implement a frequency divider capable of dealing with the $f_{out}$ in the range from 2 GHz to 8 GHz and a PLL circuit using the same.

As above, the embodiments of the present invention are explained, however, the embodiments described above are merely for explaining the invention and it is possible for a person skilled in the art to easily understand that there can be various kinds of modified examples in the scope of claims.

It is possible to apply the present invention to a frequency divider configured to divide a high-speed oscillation signal and a circuit using the same.

What is claimed is:

1. A frequency divider comprising:
    an oscillation circuit having M delay elements connected so that an output signal of a previous stage is input as an input signal of a subsequent stage, an output signal of a final stage is input as an input signal of an initial stage, and the input signal of the initial stage is reversed from the output signal of the final stage, wherein M is even integer not less than 2; and
    at least one locked signal injection circuit configured to generate a locked signal from an input oscillation signal, which regulates the change in the state of the delay elements, and to inject the generated locked signal into at least part of the delay elements, a frequency-divided signal of the input oscillation signal being output from the oscillation circuit,
    wherein, the delay elements have a division transistor, the division transistor having a control terminal and two controlled terminals, wherein an input signal is input to the control terminal, wherein an output is obtained from one of the controlled terminals, and wherein the other controlled terminal is an injection node, and
    wherein the locked signal injection circuit has:
    an injection differential pair having two auxiliary injection transistors provided in parallel so as to be connected to the injection node of the division transistor of two of the delay elements of the oscillation circuit, wherein the two of the delay elements are apart from each other with M/2−1 of the delay elements arranged therebetween; and
    a signal injection transistor connected to the injection differential pair so that a differential signal of the input oscillation signal is generated at a connection node connected to the injection node of the injection differential pair, the signal injection transistor capable of inputting the input oscillation signal to the control terminal.

2. The frequency divider according to claim 1,
    wherein the delay elements comprise a division differential pair provided in parallel and having two division transistors, each division transistor having one of controlled terminals thereof connected in common to the injection node, a differential input signal is input to control terminal of the two division transistors, and a differential output signal is output from two control terminals of the two division transistors on the opposite side of the division common node of the division transistors, and
    wherein the differential output signal of a previous stage is input as the differential input signal of a subsequent stage and the differential output signal of the final stage is input as the differential input signal of the initial stage.

3. The frequency divider according to claim 2,
wherein the controlled terminal of the two auxiliary injection transistors of the injection differential pair, which is on the opposite side of the terminal to be controlled connected to the injection node, is connected to an injection common node, and
wherein the signal injection transistor is connected between the injection common node and a power source terminal.

4. The frequency divider according to claim 2, wherein
the two auxiliary injection transistors of the injection differential pair are connected between the injection node and a power source terminal, and
the signal injection transistor is connected between the injection nodes.

5. The frequency divider according to claim 3,
wherein the M is equal to 4,
wherein the frequency divider has two locked signal injection circuits, which are a first locked signal injection circuit and a second locked signal injection circuit,
wherein the two auxiliary injection transistors of the first locked signal injection circuit are connected to the injection node of a first delay element and a third delay element of the oscillation circuit,
wherein the two auxiliary injection transistors of the second locked signal injection circuit are connected to the injection node of a second delay element and a fourth delay element of the oscillation circuit,
wherein the input oscillation signal biased by a first DC bias voltage can be input to a control terminal of the signal injection transistor of the first locked signal injection circuit, and
wherein a signal in opposite phase of the input oscillation signal biased by the first DC bias voltage can be input to a control terminal of the signal injection transistor of the second locked signal injection circuit.

6. The frequency divider according to claim 4,
wherein the M is equal to 4,
wherein the frequency divider has two locked signal injection circuits, which are a first locked signal injection circuit and a second locked signal injection circuit,
wherein the two auxiliary injection transistors of the first locked signal injection circuit are connected to the injection node of first and third delay elements of the oscillation circuit,
wherein the two auxiliary injection transistors of the second locked signal injection circuit are connected to the injection node of second and fourth delay elements of the oscillation circuit,
wherein the input oscillation signal biased by a first DC bias voltage can be input to a control terminal of the signal injection transistor of the first locked signal injection circuit, and
wherein a signal in opposite phase of the input oscillation signal biased by the first DC bias voltage can be input to a control terminal of the signal injection transistor of the second locked signal injection circuit.

7. The frequency divider according to claim 5,
wherein a signal in phase and a signal in opposite phase of a second input oscillation signal biased by a second DC bias voltage can be input to a control terminal of the two auxiliary injection transistors of the first locked signal injection circuit, and
wherein the control terminal of the two auxiliary injection transistors of the second locked signal injection circuit is biased by the second DC bias voltage.

8. The frequency divider according to claim 6,
wherein a signal in phase and a signal in opposite phase of a second input oscillation signal biased by a second DC bias voltage can be input to a control terminal of the two auxiliary injection transistors of the first locked signal injection circuit, and
wherein the control terminal of the two auxiliary injection transistors of the second locked signal injection circuit is biased by the second DC bias voltage.

9. The frequency divider according to claim 3, wherein the M is equal to 8, the frequency divider further comprising: eight initial stage injection transistors configured to be connected to the injection nodes of the eight delay elements; and four initial injection differential pairs,
wherein a first controlled terminal of two of the initial stage injection transistors, is on the opposite side of a second controlled terminal of the two of the initial stage injection transistors connected to the injection node, the two of the initial stage injection transistors being apart from each other with three of the initial stage transistors arranged therebetween,
wherein the first controlled terminal is connected to an initial common node so that a first initial injection differential pair of the four initial injection differential pairs is formed,
wherein the frequency divider has two locked signal injection circuits, which are a first locked signal injection circuit and a second locked signal injection circuit,
wherein the two auxiliary injection transistors of the first locked signal injection circuit are connected to the initial common node of the first initial injection differential pair and a third initial injection differential pair,
wherein the two auxiliary injection transistors of the second locked signal injection circuit are connected to the initial common node of a second initial injection differential pair and a fourth initial injection differential pair,
wherein a signal in opposite phase of the input oscillation signal biased by a first DC bias voltage can be input to a control terminal of the signal injection transistor of the first locked signal injection circuit, and
wherein the input oscillation signal biased by the first DC bias voltage can be input to a control terminal of the signal injection transistor of the second locked signal injection circuit.

10. The frequency divider according to claim 4, wherein the M is equal to 8, the frequency divider further comprising: eight initial stage injection transistors configured to be connected to the injection nodes of the eight delay elements; and four initial injection differential pairs,
wherein a first controlled terminal of two of the initial stage injection transistors, is on the opposite side of a second controlled terminal of the two of the initial stage injection transistors connected to the injection node, the two of the initial stage injection transistors being apart from each other with three of the initial stage transistors arranged therebetween,
wherein the first controlled terminal is connected to an initial common node so that a first initial injection differential pair of the four initial injection differential pairs is formed,
wherein the frequency divider has two locked signal injection circuits, which are a first locked signal injection circuit and a second locked signal injection circuit,
wherein the two auxiliary injection transistors of the first locked signal injection circuit are connected to the initial common node of the first initial injection differential pair and a third initial injection differential pair, wherein the two auxiliary injection transistors of the second locked signal injection circuit are connected to the initial common node of a second initial injection differential pair and a fourth initial injection differential pair, wherein a signal in opposite phase of the input oscillation signal biased by a first DC bias voltage can be input to a control terminal of the signal injection transistor of the first locked signal injection circuit, and wherein the input oscillation signal biased by the first DC bias voltage can be input to a control terminal of the signal injection transistor of the second locked signal injection circuit.

11. The frequency divider according to claim 9, wherein a signal in phase and a signal in opposite phase of a second input oscillation signal biased by a second DC bias voltage can be input to a control terminal of the two signal injection transistors of the first locked signal injection circuit, wherein a control terminal of the two auxiliary injection transistors of the second locked signal injection circuit is biased by the second DC bias voltage, and wherein a control terminal of the eight initial stage injection transistors is biased by a first DC bias voltage.

12. The frequency divider according to claim 10, wherein a signal in phase and a signal in opposite phase of a second input oscillation signal biased by a second DC bias voltage can be input to a control terminal of the two signal injection transistors of the first locked signal injection circuit, wherein a control terminal of the two auxiliary injection transistors of the second locked signal injection circuit is biased by the second DC bias voltage, and wherein a control terminal of the eight initial stage injection transistors is biased by a first DC bias voltage.

13. A PLL circuit comprising:

a voltage-controlled oscillator;

a frequency divider configured to divide a clock output from the voltage-controlled oscillator and to output a divided clock;

a phase/frequency detection circuit configured to detect a phase difference and a frequency difference between a reference clock and the divided clock and to output a control signal;

a charge pump configured to generate a level signal in accordance with the control signal; and a low-pass filter configured to output a low frequency signal, which is a low frequency component extracted from the level signal, wherein the voltage-controlled oscillator is a PPL circuit configured to change the oscillation frequency in accordance with the low frequency signal output from the low-pass filter, and the frequency divider comprises the frequency divider according to claim 1.

* * * * *